US 9,065,400 B2

(12) United States Patent
Larson

(10) Patent No.: US 9,065,400 B2
(45) Date of Patent: Jun. 23, 2015

(54) PROGRAMMABLE-GAIN INSTRUMENTATION AMPLIFIER

(71) Applicant: Honeywell International Inc., Morristown, NJ (US)

(72) Inventor: Mark R. Larson, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/033,113

(22) Filed: Sep. 20, 2013

(65) Prior Publication Data

US 2015/0084693 A1     Mar. 26, 2015

(51) Int. Cl.
| H03F 1/36 | (2006.01) |
| H03F 3/45 | (2006.01) |
| H03G 3/30 | (2006.01) |
| H03G 1/00 | (2006.01) |

(52) U.S. Cl.
CPC ......... *H03F 3/45071* (2013.01); *H03G 3/3026* (2013.01); *H03F 2200/252* (2013.01); *H03F 2203/45528* (2013.01); *H03G 1/0088* (2013.01)

(58) Field of Classification Search
CPC .... H04B 1/04; H04B 2001/0408; H03F 1/24; H03F 2203/21154; H03F 3/2178; H03F 2203/7236; H03F 3/193; H03F 3/195; H03F 3/211; H03F 3/245; H03F 2200/451; H03F 3/45968
USPC ................ 330/51, 69, 86, 254, 282
See application file for complete search history.

(56) References Cited

U.S. PATENT DOCUMENTS

| 5,233,309 A * | 8/1993 | Spitalny et al. ................. 330/86 |
| 6,628,164 B2 | 9/2003 | Ramesh et al. |
| 6,972,625 B2 | 12/2005 | Nguyen et al. |
| 7,068,108 B2 | 6/2006 | Xu et al. |
| 7,154,329 B2 | 12/2006 | Douglas |
| 7,425,863 B2 | 9/2008 | Gatta et al. |
| 7,583,143 B2 | 9/2009 | Pan |

(Continued)

FOREIGN PATENT DOCUMENTS

| EP | 2075910 A1 | 7/2009 |
| WO | 9314564 A1 | 7/1993 |

OTHER PUBLICATIONS

Sanz et al., "MOS Current Divider Based PGA," Microelectronics Reliability 45 (2005) 727-732, available online at www.sciencedirect.com, Nov. 6, 2005, 6 pp.

(Continued)

*Primary Examiner* — Khanh V Nguyen
(74) *Attorney, Agent, or Firm* — Shumaker & Sieffert, P.A.

(57) ABSTRACT

A device comprises a first amplifier, a first resistive element that comprises a first resistor and a first dummy switch, a second amplifier, a second resistive element that comprises a second resistor and a second dummy switch, and a programmable resistive gain element operable to receive control input, wherein a resistance value of the programmable resistive gain element is based at least in part on the received control input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

18 Claims, 3 Drawing Sheets

(56) References Cited

U.S. PATENT DOCUMENTS

| | | | |
|---|---|---|---|
| 7,605,659 | B2 | 10/2009 | Hughes |
| 7,679,447 | B2 | 3/2010 | Oishi |
| 7,795,978 | B2* | 9/2010 | Watai .................. 330/282 |
| 7,919,952 | B1 | 4/2011 | Fahrenbruch |
| 7,948,315 | B2 | 5/2011 | Shifrin |
| 8,195,117 | B2 | 6/2012 | Bult et al. |
| 8,229,382 | B2 | 7/2012 | Mak et al. |
| 8,279,007 | B2 | 10/2012 | Wei et al. |
| 8,324,969 | B2 | 12/2012 | Loeda et al. |
| 8,344,822 | B2 | 1/2013 | Wang |
| 8,350,738 | B2 | 1/2013 | Sanduleanu et al. |
| 8,362,836 | B2 | 1/2013 | Gilbert et al. |
| 2009/0079501 | A1 | 3/2009 | Watai |
| 2009/0167432 | A1* | 7/2009 | van den Heuvel ........... 330/69 |
| 2010/0259323 | A1* | 10/2010 | Bugyik ..................... 330/69 |

OTHER PUBLICATIONS

Analog Devices, "Programmable Gain Instrumentation Amplifier," 2000, 15 pages, available online at www.analog.com/static/imported-files/data_sheets/AD625.pdf.

Wu, "Pay Attention to Switch Arrangement to Improve PGA Performance," 2007, 2 pages, available online at http://electronicdesign.com/print/power/pay-attention-switch-arrangement-improve-pga-performance.

Analog Devices, "Zero Drift, digitally Programmable Instrumentation Amplifier," 2007, 24 pages, available online at www.analog.com/static/imported-files/data_sheets/AD8231.pdf.

Analog Devices, "Digitally Programmable Sensor Signal Amplifier with EMI Filters," 2005, 28 pages, available online at www.analog.com/static/imported-files/data_sheets/AD8556.pdf.

Linear Technology, "Zero Drift, Precision Instrumentation Amplifier with Digitally Programmable Gain," 2004, 18 pages, available online at www.cds.linear.com/docs/en/datasheet/6915fb.pdf.

Extended Search Report from counterpart European Application No. 14176166.8, dated Jan. 16, 2015, 8 pp.

"Digitally Controlled Programmable Gain Amplifies in SOT-23," LTC6910, Linear Technology Corporation, retrieved from http://cds.linear.com/docs/en/datasheet/6910123fa.pdf on Jan. 27, 2014, 24 pp.

Response to Extended European Search Report and Opinion dated Jan. 16, 2015, from counterpart European Patent Application No. 14176166.8, filed Apr. 21, 2015, 21 pp.

* cited by examiner

PROGRAMMABLE-GAIN INSTRUMENTATION AMPLIFIER

STATEMENT REGARDING FEDERALLY SPONSORED RESEARCH OR DEVELOPMENT

This invention was made with Government support under FA8650-10-M-2084 awarded by Air Force Research Laboratory. The Government has certain rights in the invention.

TECHNICAL FIELD

This disclosure relates to integrated circuits and, more particularly, to instrumentation amplifiers in integrated circuits.

BACKGROUND

Various applications, including laboratory, industrial, and audio applications, for example, share the need to measure the relatively small voltage difference, referred to as a differential mode voltage, between two individual voltages when a potentially very large voltage, referred to as a common mode voltage, is common to both of the individual voltages. That is, the common mode voltage is the voltage shared by the inputs, where the differential mode voltage is the voltage not shared. Instrumentation amplifiers may fill this need by rejecting the superimposed common voltage, i.e., common mode voltage, on two individual input voltages, and generating an output voltage that is directly proportional to the difference between the two individual input voltages, i.e., differential mode voltage. Thus, the output voltage, $V_{OUT}$, of an instrumentation amplifier is characterized by the operation of a common mode gain, $A_{CM}$, and a differential gain, $A_{DM}$, on the two input voltages, $V_{IN1}$ and $V_{IN2}$, according to Equation 1.

$$V_{OUT} = A_{DM}(V_{IN2} - V_{IN1}) + A_{CM}\frac{(V_{IN2} + V_{IN1})}{2} \quad (1)$$

An ideal instrumentation amplifier may have a constant differential mode gain (i.e. constant value for $A_{DM}$) and may have a common mode gain ($A_{CM}$) of zero, meaning the common mode voltage is completely removed from the output. In practice, the common mode gain ($A_{CM}$) may not be zero but may be much less than the differential mode gain ($A_{DM}$). An important measurement for instrumentation amplifiers is the common mode rejection ratio (CMRR), which is a ratio of the common mode gain ($A_{CM}$) to the differential gain ($A_{DM}$) expressed in decibels (dB). Typical instrumentation amplifiers may have CMRR in the range of 30 to 100 dB. The higher the CMRR, the closer an instrumentation amplifier is to ideal.

Typical instrumentation amplifiers are implemented using operational amplifiers and four or more resistors. The magnitude of resistance presented by particular resistors in the instrumentation amplifier may dictate the gain of the amplifier.

SUMMARY

Aspects of the present disclosure may provide a digitally programmable, programmable-gain instrumentation amplifier that does not need to rely on external components for accurate gain setting, while maintaining fine gain adjustment control (e.g., in excess of 128 gain settings). In this way, aspects of the present disclosure may provide an amplifier that has accurate gain control, and low gain drift compared to amplifiers having a gain value dependent on external components. That is, aspects of the present disclosure may provide accurate amplification that is highly resilient with respect to changes in operating conditions such as temperature.

In one example a device includes a first amplifier that comprises a first non-inverting input, a first inverting input, and a first output, wherein the first non-inverting input of the first amplifier is connected to a first input voltage terminal and a first resistive element that comprises a first resistor and a first dummy switch, wherein a first end of the first resistive element is connected to the first output of the first amplifier, and a second end of the first resistive element is connected to the first inverting input of the first amplifier. The device further includes a second amplifier that comprises a second non-inverting input, a second inverting input, and a second output, wherein the second non-inverting input of the second amplifier is connected to a second input voltage terminal and a second resistive element that comprises a second resistor and a second dummy switch, wherein a first end of the second resistive element is connected to the second output of the second amplifier, and a second end of the second resistive element is connected to the second inverting input of the second amplifier. The device also includes a programmable resistive gain element operable to receive control input, wherein a resistance value of the programmable resistive gain element is based at least in part on the received control input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

In another example a device includes a first amplifier that comprises a first non-inverting input, a first inverting input, and a first output, wherein the first non-inverting input of the first amplifier is connected to a first input voltage terminal, a second amplifier that comprises a second non-inverting input, a second inverting input, and a second output, wherein the second non-inverting input of the second amplifier is connected to a second input voltage terminal, and a third amplifier that comprises a third non-inverting input, a third inverting input, and a third output, wherein the third output of the third amplifier is connected to an output voltage terminal. The device further includes a first resistor, wherein a first end of the first resistor is connected to the first output of the first amplifier, and a second end of the first resistor is connected to a first end of a first dummy switch, a second resistor, wherein a first end of the second resistor is connected to the second output of the second amplifier, and a second end of the second resistor is connected to a first end of a second dummy switch, and a third resistor, wherein a first end of the third resistor is also connected to the first output of the first amplifier, and a second end of the third resistor is connected to the third inverting input of the third amplifier. The device also includes a fourth resistor, wherein a first end of the fourth resistor is connected to the second output of the second amplifier, and a second end of the fourth resistor is connected to the third non-inverting input of the third amplifier, a fifth resistor, wherein a first end of the fifth resistor is connected to the third inverting input of the third amplifier, and a second end of the fifth resistor is connected to the third output of the third amplifier, a sixth resistor, wherein a first end of the sixth resistor is connected to the third non-inverting input of the third amplifier, and a second end of the sixth resistor is connected to ground, and a programmable resistive gain element operable to receive input and adjust a resistance value of the resistive element based at least in part on the received input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

In another example an integrated circuit includes a first amplifier that comprises a non-inverting input, an inverting input, and an output, wherein the non-inverting input is connected to a first input voltage terminal, a second amplifier that comprises a non-inverting input, an inverting input, and an output, wherein the non-inverting input is connected to a second input voltage terminal, and a third amplifier that comprises a non-inverting input, an inverting input, and an output, wherein the output is connected to an output voltage terminal. The integrated circuit further includes a first resistor, wherein a first end of the first resistor is connected to the output of the first amplifier, and a second end of the first resistor is connected to a first end of a first dummy switch, a second resistor, wherein a first end of the second resistor is connected to the output of the second amplifier, and a second end of the second resistor is connected to a first end of a second dummy switch, and a third resistor, wherein a first end of the third resistor is also connected to the output of the first amplifier, and a second end of the third resistor is connected to the inverting input of the third amplifier. The integrated circuit also includes a fourth resistor, wherein a first end of the fourth resistor is connected to the output of the second amplifier, and a second end of the fourth resistor is connected to the non-inverting input of the third amplifier, a fifth resistor, wherein a first end of the fifth resistor is connected to the inverting input of the third amplifier, and a second end of the fifth resistor is connected to the output of the third amplifier, a sixth resistor, wherein a first end of the sixth resistor is connected to the non-inverting end of the third amplifier, and a second end of the sixth resistor is connected to ground, and a programmable resistive gain element operable to receive input and adjust a resistance value of the programmable resistive gain element based at least in part on the received input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

The details of one or more examples are set forth in the accompanying drawings and the description below. Other features, objects, and advantages will be apparent from the description and drawings, and from the claims.

DETAILED DESCRIPTION

Figure 1:
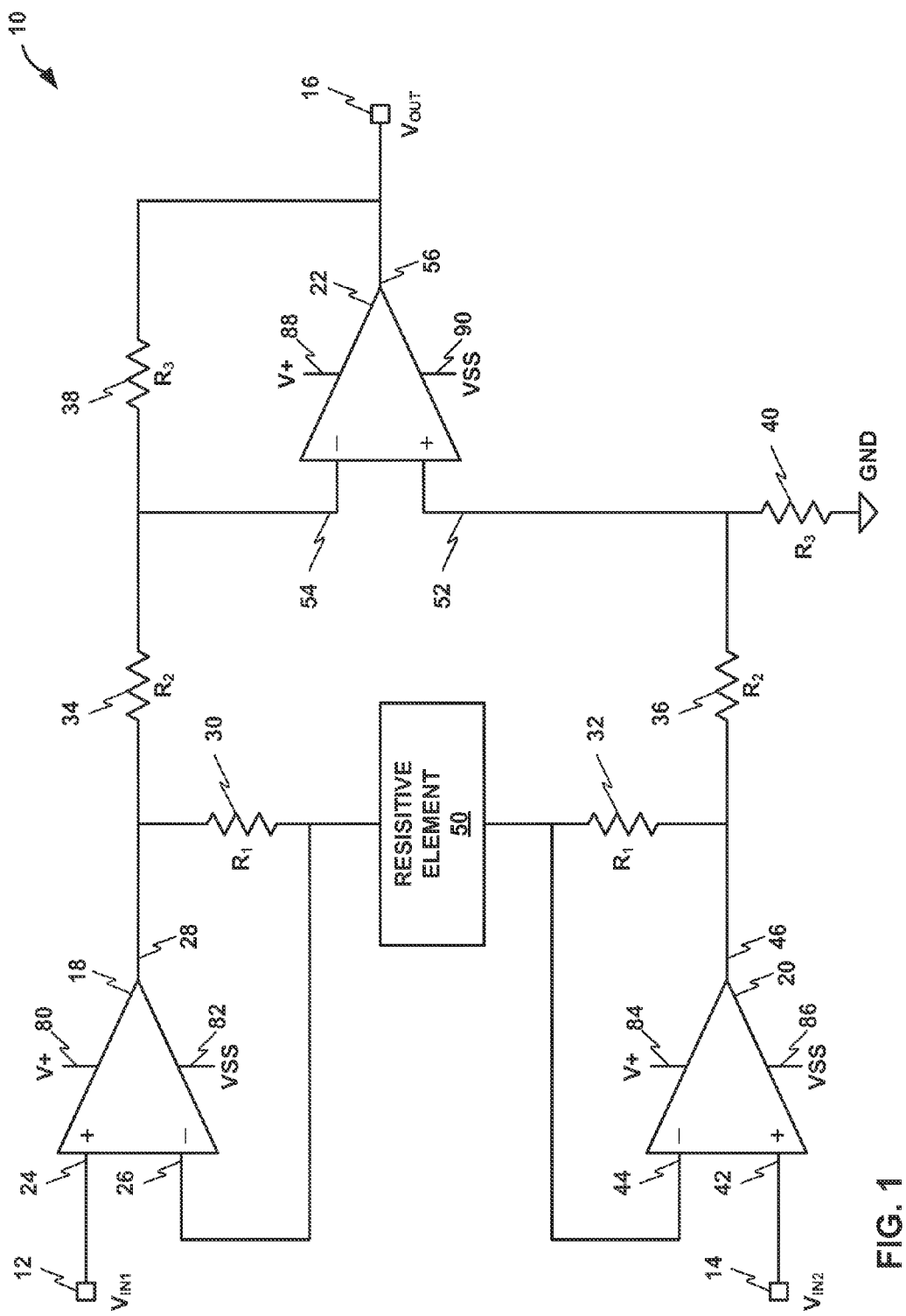
FIG. 1 is a circuit diagram illustrating one example of a programmable-gain amplifier, in accordance with one or more aspects of the present disclosure.

The gain of traditional instrumentation amplifiers may be a set value corresponding to a ratio of resistance values between components in the instrumentation amplifier. Examples of instrumentation amplifiers may include adjustable or programmable-gain instrumentation amplifiers. In some examples, these instrumentation amplifiers are in the form of monolithic integrated circuits. In other examples, one or more external components may be used. For instance, in the case of adjustable gain instrumentation amplifiers, the gain adjustment may commonly be made by the use of an external component (e.g., a resistor). Once the resistor is in place, the gain of the instrumentation amplifier may be fixed, making it difficult and/or impractical to adjust the gain further. Additionally, achieving an accurate gain is contingent upon matching a pair of resistors that have as close to identical resistance characteristics (e.g., temperature coefficients) as is feasible. A temperature coefficient may be a value used to describe how resistance and/or conductance will change based on operating temperature. For instance, two resistive elements that have the same or similar temperature coefficients may experience the same or similar increases in resistance value when subjected to higher temperatures. Different resistance characteristics, such as temperature coefficients or changes in input signal voltage, may cause gain drift, distortion and/or non-linearity in the output voltage.

Programmable-gain, monolithic instrumentation amplifiers provide a gain that is programmed, for example, by digital (e.g., logic) control. The digital logic is used to apply one of multiple "on-chip" gain-setting resistors. Programmable-gain instrumentation amplifiers that do not rely on external components may achieve better gain accuracy (e.g., more precise gain values, lower gain drift) when compared to adjustable instrumentation amplifiers, without requiring highly accurate gain-setting resistor values. However, programmable-gain instrumentation amplifiers may be limited in the number of gain settings that are available. That is, adding a large number of gain settings may become prohibitive or even impossible when an application requires a wide variety of gain values. The limitation on gain settings may be due to practical limitations of the resistor and switch networks implemented on-chip. Additionally, the resistance characteristics (e.g., temperature coefficient, voltage coefficient) of the switches themselves may affect the gain and linearity of instrumentation amplifiers, since the switches themselves may act as resistive elements. For instance, the resistance of elements of an instrumentation amplifier may vary depending on the temperature in which the amplifier is operating. Such variability may effectively modulate the output voltage by changing the differential gain. As another example, the resistance of some elements, such as the on-resistance of switches, may be affected by various operating voltages (e.g., the gate voltage and/or the input signal voltage). Changing on-resistance values, in some examples, could change the resistance ratio and thus the gain of the instrumentation amplifier. That is, during varying operating conditions, such as heat or cold, or during varying operating parameters, such as varying input signal voltages, switches may undesirably increase or decrease the gain of the amplifier. Such change in the gain of an amplifier as a result of temperature fluctuations and/or input signal voltage is commonly referred to as gain drift.

Aspects of the present disclosure may provide a digitally programmable, programmable-gain instrumentation amplifier that does not rely on external components for accurate gain setting, while maintaining fine gain adjustment control (e.g., in excess of 128 gain settings). In this way, aspects of the present disclosure may provide an amplifier that has accurate gain control and low gain drift compared to amplifiers having a gain value dependent on external components. That is, aspects of the present disclosure may provide accurate amplification that is highly resilient with respect to changes in operating conditions such as temperature or input signal voltage. Devices utilizing one or more techniques of the present disclosure may improve gain tracking over temperature and input signal voltage and may not require external components.

FIG. 1 is a circuit diagram illustrating one example of a programmable-gain amplifier, in accordance with one or more aspects of the present disclosure. The circuit diagram of FIG. 1 includes instrumentation amplifier 10. In some examples, one or more techniques of the present disclosure may be implemented in other amplification circuits or in other contexts where precise resistance ratios may be employed, such as inverting and non-inverting amplification circuits with a single operational amplifier and two resistive elements. In the example of FIG. 1, all the elements of instrumentation amplifier 10 are implemented inside a monolithic integrated circuit. Instrumentation amplifier 10 is operable to receive input voltages $V_{IN1}$ and $V_{IN2}$ at connection point 12 and connection point 14, respectively. Instrumentation amplifier 10 may amplify the difference between the input voltage values (e.g., $V_{IN2}-V_{IN1}$), and output the amplified voltage $V_{OUT}$ at connection point 16.

Instrumentation amplifier 10, as shown in FIG. 1, includes operational amplifiers (op-amps) 18, 20, and 22. Each of op-amps 18, 20, and 22 may be a DC-coupled, high-gain voltage amplifier with a differential input and at least one output. That is, op-amps 18, 20, and 22 may provide differential voltage amplification. In some examples, op-amps may include a non-inverting input, an inverting input, and a non-inverting output. Example op-amps may generally include a differential amplifier, a voltage amplifier, and an output amplifier. An op-amp may also include inputs for power supply voltages. In some examples, op-amps may include more or fewer inputs or outputs.

In the example of FIG. 1, op-amp 18 includes non-inverting input 24, inverting input 26, and non-inverting output 28. Op-amp 18 also includes supply inputs 80 and 82. Non-inverting input 24 of op-amp 18 is connected to connection point 12, and may receive the first input voltage, $V_{IN1}$. Non-inverting output 28 of op-amp 18 is connected to both a first end of a first resistor 30, with resistance $R_1$, as well as a first end of a third resistor 34, with resistance $R_2$. Inverting input 26 of op-amp 18 is connected to the other end of first resistor 30. Supply input 80 is connected to V+ and supply input 82 is connected to VSS. V+ and VSS are power supply connection points to instrumentation amplifier 10. V+ may be any value, depending on the specific application of the amplifier (e.g., generally ranging from +2 Volts to +30 Volts or more with respect to ground). Similarly, VSS may be any value, depending on amplifier application (e.g., generally ranging from 0 Volts to −30 Volts or more with respect to ground).

Op-amp 20, as shown in the example of FIG. 1, includes non-inverting input 42, inverting input 44, and non-inverting output 46. Op-amp 20 also includes supply inputs 84 and 86. Non-inverting input 42 of op-amp 20 is connected to connection point 14, and may receive the second input voltage, $V_{IN2}$. Non-inverting output 46 of op-amp 20 is connected to both a first end of a second resistor 32, with resistance $R_1$, as well as a first end of a fourth resistor 36, with resistance $R_2$. Inverting input 44 of op-amp 20 is connected to the other end of second resistor 32. Supply input 84 is connected to V+ and supply input 86 is connected to VSS.

In the example of FIG. 1, op-amp 22 includes non-inverting input 52, inverting input 54, and non-inverting output 56. Op-amp 22 also includes supply inputs 88 and 90. Non-inverting input 52 of op-amp 22 is connected to a second end of fourth resistor 36, as well as a first end of sixth resistor 40, having resistance $R_3$. In the example of FIG. 1, a second end of sixth resistor 40 is connected to ground (labeled as "GND" in FIG. 1). In other examples, the second end of sixth resistor 40 may be connected to a reference voltage. Connecting the second end of sixth resistor 40 to a reference voltage may offset $V_{OUT}$ by the magnitude of the reference voltage. Such offset may be beneficial in various examples, such as when instrumentation amplifier 10 is operating in a single-supply system where $V_{OUT}$ cannot swing below ground. Inverting input 54 of op-amp 22 is connected to a second end of third resistor 34 and to a first end of fifth resistor 38, with resistance $R_3$. Non-inverting output 56 of op-amp 22 is connected to both a second end of fifth resistor 38, as well as connection point 16. That is, non-inverting output 56 of op-amp 22 may provide an amplified output voltage, $V_{OUT}$, proportional to the voltage differential between the inputs $V_{IN1}$ and $V_{IN2}$. Supply input 88 is connected to V+ and supply input 90 is connected to VSS. In some examples, supply inputs 80, 84, and 88 may be connected to the same V+ and supply inputs 82, 86, and 90 may be connected to the same VSS. That is, op-amps 18, 20, and 22 may share a power supply. In other examples, each of op-amps 18, 20, and 22 may be powered by a separate power supply.

Instrumentation amplifier 10, as shown in the example of FIG. 1, also includes resistive element 50. A second end of first resistor 30 is connected to a first end of resistive element 50, and a second end of resistive element 50 is connected to a second end of resistor 32. Resistive element 50 may have a programmable resistance value, $R_{GAIN}$. The differential mode gain of instrumentation amplifier 10, as shown in FIG. 1, thus is defined by Equation 2 below.

$$\frac{V_{OUT}}{V_{IN2} - V_{IN1}} = \left(1 + \frac{2R_1}{R_{GAIN}}\right)\frac{R_3}{R_2} \qquad (2)$$

That is, the overall gain of instrumentation amplifier 10, ($V_{OUT}/(V_{IN2}-V_{IN1})$), may include a first gain stage, $(1+(2R_1/R_{GAIN}))$, and a second gain stage, $(R_3/R_2)$. While described with respect to the first gain stage of amplifier 10, one or more aspects of the present disclosure may be readily applied to the second gain stage (e.g., by replacing third resistor 34 and/or fourth resistor 36 with an instance of resistive element 50) in addition or in the alternative. Resistive element 50 may also be used to determine gain of various other amplification circuits in other instances.

By implementing resistive element 50 as one or more on-chip, monolithic resistors, the gain accuracy of instrumentation amplifier 10 may be inherently high compared to amplifiers that have a gain value based in part on external components. Additionally, the resistance characteristics of resistive element 50, such as a temperature coefficient, a voltage coefficient, or other characteristics may closely track the resistance characteristics of other on-chip resistors (e.g., first resistor 30 and second resistor 32), yielding accurate ratio matching and very low gain drift (e.g., compared to amplifiers using one or more external components) over a wide range of input signal voltages and operating temperatures, such as −55 degrees Celsius to +300 degrees Celsius or beyond. By changing the value of $R_{GAIN}$ (e.g., using programmable logic), resistive element 50 may define the gain value for the first stage of instrumentation amplifier 10, and thus the gain value for instrumentation amplifier 10 as a whole. Further details of resistive element 50 are described below with respect to FIGS. 2 and 3.

Figure 2:
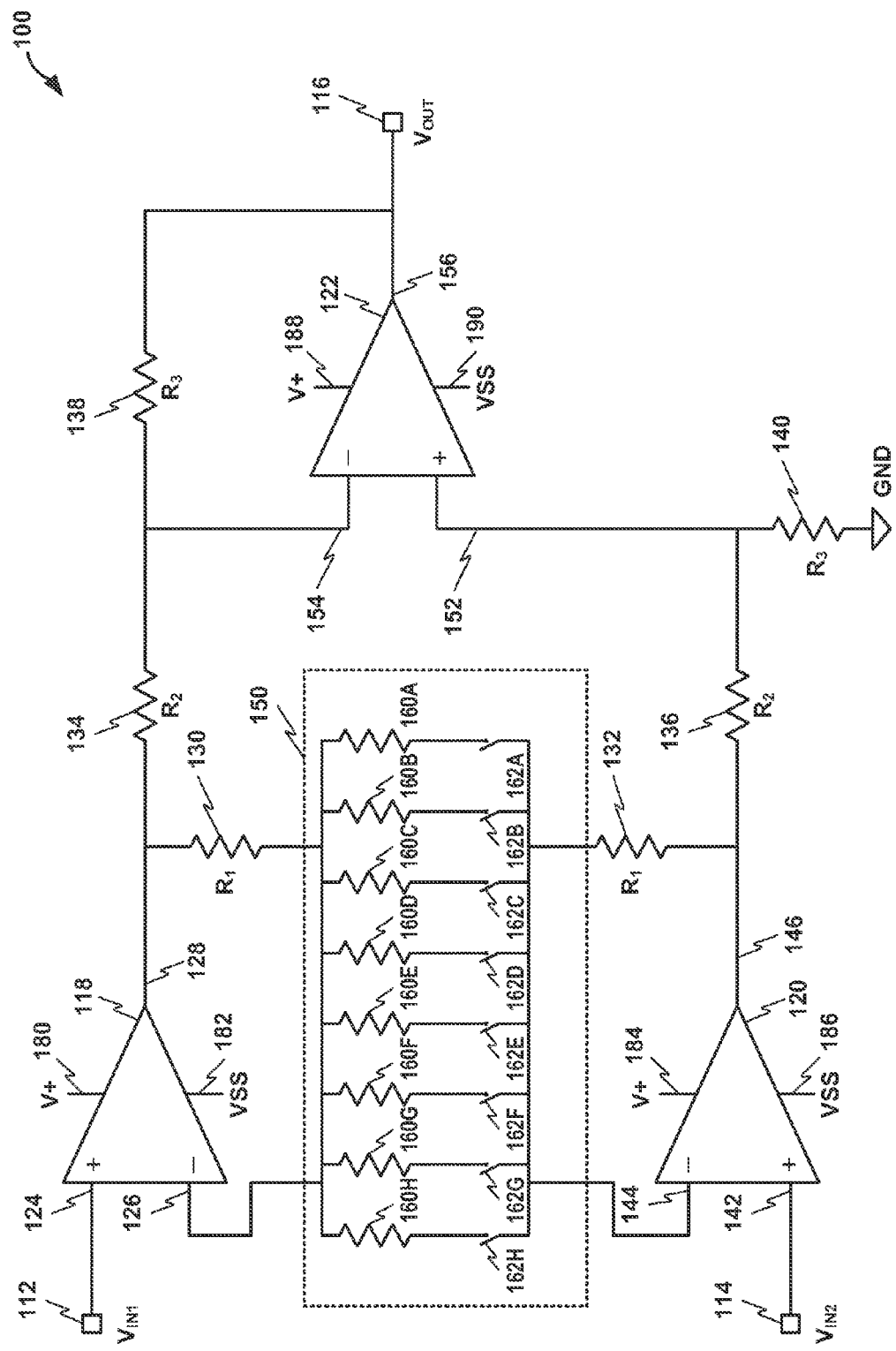
FIG. 2 is a circuit diagram illustrating one example of a programmable-gain amplifier, in accordance with one or more aspects of the present disclosure.

FIG. 2 is a circuit diagram illustrating one example of a programmable-gain amplifier 100, in accordance with one or more aspects of the present disclosure. In some examples, amplifier 100 may be similar to amplifier 10 illustrated in FIG. 1. That is, as shown in FIG. 2, amplifier 100 may include components such as op-amps 118, 120, and 122, as well as first resistor 130, second resistor 132, third resistor 134, fourth resistor 136, fifth resistor 138, and sixth resistor 140. In other examples, amplifier 100 may include more or fewer components.

Amplifier 100, in the example of FIG. 2, includes resistive element 150. Resistive element 150 includes gain resistors 160A-160H (collectively "gain resistors 160") and gain switches 162A-162H (collectively "gain switches 162"). Each of gain resistors 160 and gain switches 162 includes a first end and a second end. The first end of each of gain resistors 160 is connected to the second end of first resistor 130, as well as to inverting input 126 of op-amp 118. The second end of each of gain resistors 160 is connected to the first end of a respective one of gain switches 162. For instance, the second end of gain resistor 160A is connected to the first end of gain switch 162A, the second end of gain resistor 160B is connected to the first end of gain switch 162B, and so on. The second end of each of gain switches 162 is connected to the second end of second resistor 132, as well as to inverting input 144 of op-amp 120. That is, in the example of FIG. 2, resistive element 150 is structured as parallel groupings of a resistor and switch in series. In other examples, gain resistors 160 and gain switches 162 may be organized in a different architecture. While shown in FIG. 2 as 8 parallel resistor/switch groupings, resistive element 150 may include more or fewer resistor/switch groupings, such as 16 groupings, 4 groupings, or even a single resistor/switch grouping.

In some examples, gain resistors 160 may each have the same resistance value. In other examples, one or more of gain resistors 160 may have a different resistance value. In the example of FIG. 2, the resistance values of gain resistors 160 may be binary-weighted. That is, the resistance value of a gain resistor may be twice that of the previous gain resistor. For instance, gain resistor 160A may have a resistance value of $R_{GAIN}$. Gain resistor 160B may have a resistance value twice as large as that of gain resistor 160A (e.g., $2R_{GAIN}$), gain resistor 160C may have a resistance value of $4R_{GAIN}$, and so on. By weighting the value of gain resistors 160 in such a binary manner, the overall conductance of resistive element 150 may be set to any number of values, by closing a particular combination of gain switches 162.

Each of gain switches 162 may also have a resistance value. For instance, gain switch 162A, when in the closed (i.e. active) state, may present a non-zero resistance, $R_{G-ON}$, to current flowing through gain switch 162A. Because gain switches 162 are in series with gain resistors 160, the overall resistance value of resistive element 150 may be determined by adding the resistance of those of gain switches 162 that are closed (i.e., activated) to the resistance of the respective gain resistors 160. Consequently, the resistance value of gain switches 162 may affect the gain value of the input stage of amplifier 100. For instance, when only gain switch 162A is closed, the gain of the input stage or first stage of amplifier 100 may be $(1+(2R_1/(R_{GAIN}+R_{G-ON})))$.

In some examples, making gain switches 162 very large (e.g., each having a wide channel) may make the resistance of gain switches 162 negligible with respect to the overall resistance of resistive element 150. That is, despite appearing in series with gain resistors 160, gain switches 162 may not meaningfully affect the first stage gain of amplifier 100 when gain switches 162 are sufficiently large. In other examples, the on-resistance of gain switches 162 may be made negligible by significantly increasing the resistance value of gain resistors 160 (e.g., to values much larger than the on-resistance of gain switches 162).

Gain switches 162 may, in some examples, be transistors operable to receive an input and activate (e.g., close the switch) or deactivate (e.g., open the switch) based on the input received. For instance, gain switches 162 may each be a field-effect transistor operable to receive a voltage at the gate of the transistor. If the gate voltage is sufficiently large, the transistor may allow current to flow freely through the source and drain terminals, such that the switch can be considered "closed" or "on." If, however, the gate voltage is not large enough, or effectively zero, the impedance of the transistor may prevent current from flowing between the source and drain terminals, such that the switch can be considered "open" or "off." In other examples, gain switches 162 may be other components operable to enable and disable current flow. In some examples, additional logic, such as latches, or other components may allow gain switches 162 to be programmed via a binary value. For instance, in the example of FIG. 2, gain switches 162 may be programmable via input of a single byte (e.g., eight bits) of data.

In the example of FIG. 2, gain resistors 160 and/or gain switches 162 are implemented as internal, on-chip components. That is, in some examples, amplifier 100 may be a monolithic device. By organizing resistive element 150 as a binary-weighted array of eight switched parallel resistors, the resistance value of resistive element 150 may be set to 255 equally-weighted increments using only eight inputs (e.g., control signals). In other words, the number of possible resistance values is doubled with each resistor/switch pair included. The binary array may take on any integer value up to the practical limit imposed by total resistor area and/or matching for a specific application. In this way, techniques of the present disclosure may provide a versatile programmable-gain instrumentation amplifier that is capable of a large number of gain values without requiring a large number of input control signals or a large number of switches.

Figure 3:
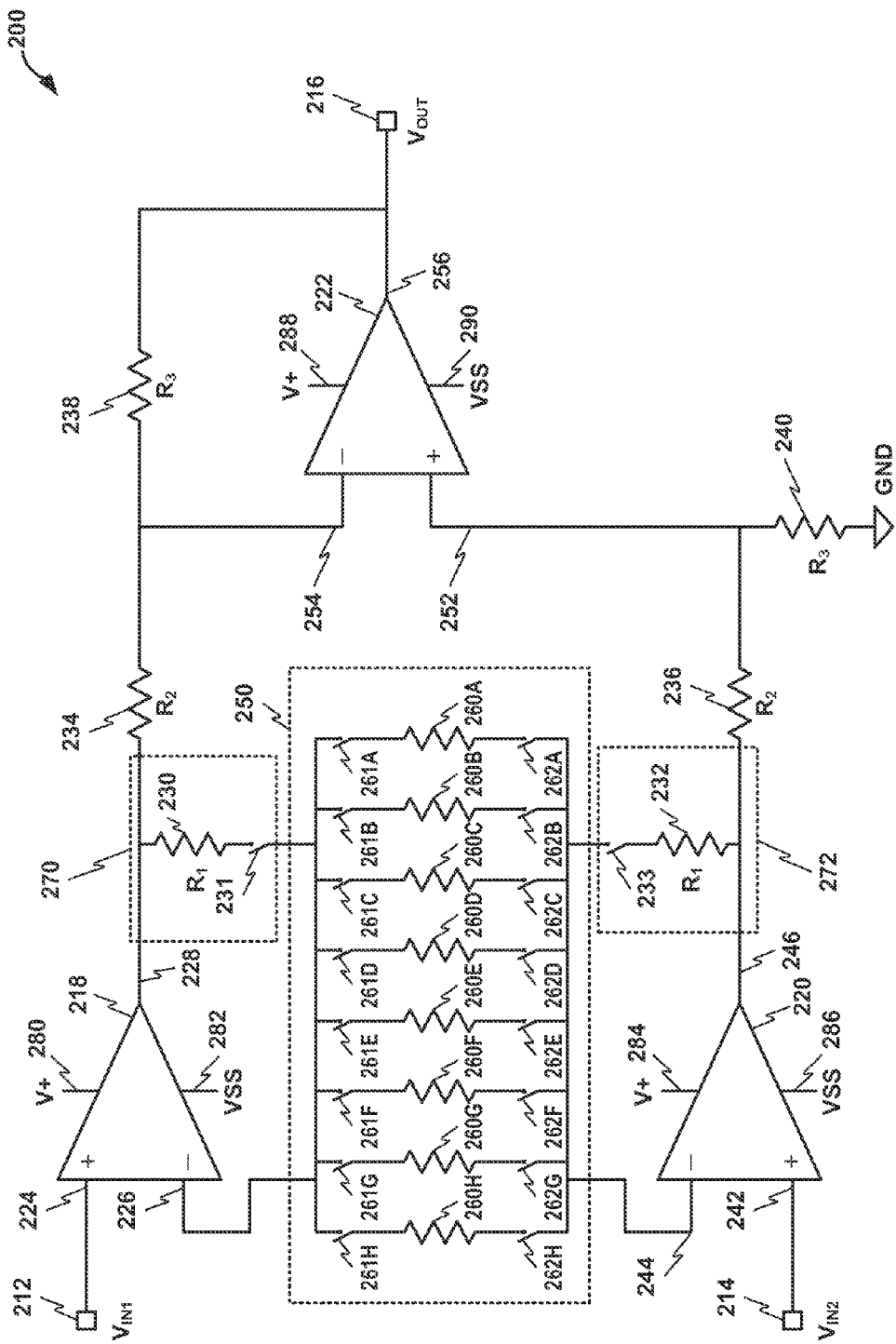
FIG. 3 is a circuit diagram illustrating one example of a programmable-gain amplifier, in accordance with one or more aspects of the present disclosure.

FIG. 3 is a circuit diagram illustrating another example of a programmable-gain amplifier 200, in accordance with one or more aspects of the present disclosure. In some examples, amplifier 200 may be similar to amplifier 10 illustrated in FIG. 1 and/or amplifier 100 illustrated in FIG. 2. As shown in FIG. 3, amplifier 200 includes op-amps 218, 220, and 222, as well as first resistor 230, second resistor 232, third resistor 234, fourth resistor 236, fifth resistor 238, and/or sixth resistor 240. In some examples, amplifier 200 may be implemented as a monolithic device. Consequently, resistance values of some or all components may have the same or similar resistance characteristics.

Amplifier 200 includes dummy switch 231 and dummy switch 233, each having a first end and a second end. The first end of dummy switch 231 is connected to the second end of first resistor 230 and the second end of dummy switch 231 is connected to the first end of resistive element 250. The first end of dummy switch 233 is connected to the second end of second resistor 232 and the second end of dummy switch 233 is connected to the second end of resistive element 250. That is, in the example of FIG. 3, dummy switches 231 and 233 are in series with the upper and lower input stage resistors.

In the example of FIG. 3, amplifier 200 includes resistive element 250. Resistive element 250 includes gain resistors 260A-260H (collectively "gain resistors 260"), first gain switches 261A-261H (collectively "first gain switches 261"), and second gain switches 262A-262H (collectively "second gain switches 262"). Each of gain resistors 260, first gain switches 261, and second gain switches 262 have a first end and a second end. The first end of each of first gain switches 261 is connected to the second end of dummy switch 231, as well as to inverting input 226 of op-amp 218. The second end of each of first gain switches 261 is connected to the first end of a respective one of gain resistors 260. The second end of each of gain resistors 260 is connected to the second end of a respective one of second gain switches 262. For instance, the second end of first gain switch 261A is connected to the first end of gain resistor 260A, and the second end of gain resistor 260A is connected to the second end of second gain switch 262A. Similarly, the second end of first gain switch 261B is connected to the first end of gain resistor 260B, and the second end of gain resistor 260B is connected to the second end of second gain switch 262B, and so on.

The first end of each of second gain switches 262 is connected to the second end of dummy switch 233, as well as to inverting input 244 of op-amp 220. That is, in the example of FIG. 3, resistive element 250 is structured as parallel groupings of a first switch, a resistor, and a second switch in series. While shown in FIG. 3 as 8 parallel switch/resistor/switch groupings, resistive element 250 may include more or fewer switch/resistor/switch groupings, such as 16 groupings, 4 groupings, or even a single switch/resistor/switch grouping.

In some examples, gain resistors 260 may each have the same resistance value. In other examples, one or more of gain resistors 260 may have a different resistance value. In the example of FIG. 3, the resistance values of gain resistors 260 may be binary-weighted. That is, the resistance value of a gain resistor may be twice that of the previous gain resistor. For instance, gain resistor 260A may have a resistance value of $R_{GAIN}$. Gain resistor 260B may have a resistance value twice as large as that of gain resistor 260A (e.g., $2R_{GAIN}$), gain resistor 260C may have a resistance value of $4R_{GAIN}$, and so on. By weighting the value of gain resistors 260 in such a binary manner, the overall conductance of resistive element 250 may be set to any of $2^N$ equally-spaced conductance values, where N is the number of parallel legs contained in resistive element 250. A particular conductance value is set by closing a particular combination of first gain switches 261 and second gain switches 262.

First gain switches 261 and second gain switches 262 may be field-effect transistors capable of allowing or restricting current flow in response to an input. Each of first gain switches 261 and second gain switches 262 may receive a voltage, as input, at a gate of the transistor, and the transistor may either allow or restrict current flow through the source and drain terminals. Respective ones of first gain switches 261 and respective ones of second gain switches 262 are controlled by the same input. For instance, the gates of first gain switch 261A and second gain switch 262A receive the same gate voltage, thereby causing both first gain switch 261A and second gain switch 262A to either both be closed or both be open.

Dummy switches 231 and 233 may be field-effect transistors similar to first gain switches 261 and second gain switches 262.

In some examples, dummy switches 231 and 233 may be in a permanently closed state. That is, dummy switches 231 and 233 may not be controlled by input and, instead, may continuously be on and allow current to flow. In other examples, dummy switches 231 and 233 may be controllable similar to first gain switches 261 and second gain switches 262. For instance, while shown in FIG. 3 as a single pairing of a resistor and a dummy switch, resistive elements 270 and 272 may each include multiple pairings, arranged in parallel, such as a first pairing wherein the resistor has a value of $R_1$, and a second pairing wherein the resistor has a value of $10R_1$. When resistive elements 270 and 272 include multiple, parallel resistor/dummy switch pairings, the multiple dummy switches of resistive elements 270 and 272 may be programmable (e.g., controlled by a voltage input), allowing the instrumentation amplifier to achieve an even greater range of gain values. In any case, when on, dummy switches 231 and 233 may present a non-zero resistance, $R_{DUMMY}$, to the current flowing through dummy switches 231 and 233, respectively. $R_{DUMMY}$ may be determined by properties of the components used to implement dummy switches 231 and 233 (e.g., channel width, component size, or other properties). In the example of FIG. 3, $R_{DUMMY}$ may be proportional to the resistance, $R_1$, of first resistor 230 and second resistor 232.

First gain switches 261 and second gain switches 262 may have a resistance value when on. The resistance of each of first gain switches 261 and second gain switches 262 may be proportional to respective ones of gain resistors 260. For instance, first gain switch 261A and second gain switch 262A may each have an on-resistance value, $R_{G-ON}$, proportional to the resistance value of gain resistor 260A, $R_{GAIN}$. First gain switch 261B and second gain switch 262B may have on-resistance values, $2R_{G-ON}$ proportional to the resistance value of gain resistor 260B, $2R_{GAIN}$. The third pairing may have an on-resistance value two times the size of the second pairing, and so on. In other words, first gain switches 261 and second gain switches 262 may also have binary-weighted on-conductance, just like gain resistors 260. For instance, when dummy switches 231 and 233 are closed, and when first gain switch 261A and second gain switch 262A are closed, the overall gain of amplifier 200 may be described by equation 3 below.

$$\frac{V_{OUT}}{V_{IN2} - V_{IN1}} = \left(1 + \frac{2(R_1 + R_{DUMMY})}{R_{GAIN} + R_{G-ON}}\right)\frac{R_3}{R_2} \quad (3)$$

In some examples, $R_{DUMMY}$ and $R_{G-ON}$ may be the same proportion to $R_1$ and $R_{GAIN}$, respectively. For instance, the resistance of each switch may be only a small percentage (e.g., 1%, 0.5% or other value) of the resistance value for the relevant resistor. By sizing $R_{DUMMY}$ in a proportion to $R_1$ similar to the proportion of $R_{G-ON}$ to $R_{GAIN}$, aspects of the present disclosure may maintain the intended resistance ratio between $R_1$ and $R_{GAIN}$, such that $R_{DUMMY}$ and $R_{G-ON}$ can be defined as a portion of $R_1$ and $R_{GAIN}$, respectively. Equation 3 may thus be reduced, and the overall gain of amplifier 200 may be described by equation 4 below.

$$\frac{V_{OUT}}{V_{IN2} - V_{IN1}} = \left(1 + \frac{2R_1}{R_{GAIN}}\right)\frac{R_3}{R_2} \quad (4)$$

In the example of FIG. 3, dummy switches and gain switches may have respective voltage coefficients and temperature coefficients that are nearly the same, allowing the on resistance for the respective switch pairings (e.g., $R_{DUMMY}$ and $R_{G-ON}$) to track together over a wide range of operating temperatures and voltages. For instance, dummy switch 231 and each of gain switches 261 may have the same operating voltage (e.g., the same gate voltage at the gate of each transistor). This same gate voltage means that the respective on resistances of dummy switch 231 and first gain switches 261, while changing with variations in amplifier input signals $V_{IN1}$ and $V_{IN2}$, will track each other and thus maintain resistance proportionality and steady gain. In a similar fashion, dummy switch 233 and second gain switches 262 also share the same gate voltage and thus maintain resistance proportionality.

Additionally, while dummy switch 231 and first gain switches 261 may generally operate at a different input signal voltage than dummy switch 233 and second gain switches 262 (e.g., due to the differential nature of the input signal voltages into the instrumentation amplifier), applying appropriate scaling factors to all switches may reduce or eliminate any discrepancies. That is, though the on-resistances of the switches on either side of gain resistors 260 may fluctuate with a dynamic input signal (e.g., inputs received at $V_{IN1}$ and $V_{IN2}$) and thus differ slightly from side to side, the gain of amplifier 200 is effectively independent of switch on-resistances. This allows for gain accuracy and stability over a wide range of temperatures as well as over wide swings in input signal voltages. Equation 4 still holds.

In accordance with one or more aspects of the present disclosure, the inclusion of first gain switches 261 and second gain switches 262 within resistive element 250 may enable amplifier 200 to provide a large number of gain values. By placing dummy switches 231 and 233 in series with first resistor 230 and second resistor 232, respectively, the techniques described herein may provide for resistive elements 270 and 272. Because resistive elements 270 and 272 each have elements similar to the elements of resistive element 250 (e.g., similar switches and resistors) the resistive characteristics may be the same or similar. Consequently, resistive elements 270 and 272 may match and/or track resistive element 250 over a wide range of input signal voltages and temperature conditions. Consequently, the inclusion of dummy switches 231 and 232 may avoid causing any mismatch in the first gain stage.

Techniques of the present disclosure may provide a device that includes a first amplifier that comprises a first non-inverting input, a first inverting input, and a first output, wherein the first non-inverting input of the first amplifier is connected to a first input voltage terminal, and a first resistive element that comprises a first resistor and a first dummy switch, wherein a first end of the first resistive element is connected to the first output of the first amplifier, and a second end of the first resistive element is connected to the first inverting input of the first amplifier. The device may further include a second amplifier that comprises a second non-inverting input, a second inverting input, and a second output, wherein the second non-inverting input of the second amplifier is connected to a second input voltage terminal, and a second resistive element that comprises a second resistor and a second dummy switch, wherein a first end of the second resistive element is connected to the second output of the second amplifier, and a second end of the second resistive element is connected to the second inverting input of the second amplifier. Finally, the device may also include a programmable resistive gain element operable to receive control input, wherein a resistance value of the programmable resistive gain element is based at least in part on the received control input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

In some examples, resistance values of the first and second resistive elements, when compared to a resistance value of the programmable resistive gain element, maintain a specified ratio regardless of operating temperatures ranging from −55 degrees Celsius to 300 degrees Celsius or other temperatures.

In some examples, the programmable resistive gain element comprises one or more gain resistors and respective gain switches. In some examples, the respective gain switches are respective first gain switches, the programmable resistive gain element further comprises respective second gain switches, the first end of the first resistive element comprises a first end of the first resistor, a second end of the first resistor is connected to a first end of the first dummy switch, and the second end of the first resistive element comprises a second end of the first dummy switch, the first end of the second resistive element comprises a first end of the second resistor, a second end of the second resistor is connected to a first end of the second dummy switch, and the second end of the second resistive element comprises a second end of the second dummy switch, and the first end of the programmable resistive gain element comprises collective first ends of each of the respective first gain switches, a second end of each of the respective first gain switches is connected to a first end of a respective one of the one or more gain resistors, a second end of each of the one or more gain resistors is connected to a second end of the respective second gain switch, and the second end of the programmable resistive gain element comprises collective first ends of each of the respective second gain switches.

In some examples, the one or more gain resistors comprise a plurality of binary-weighted gain resistors, each subsequent gain resistor in the plurality of binary-weighted gain resistors having a resistance value equal to two times a resistance value of a prior gain resistor in the plurality of binary-weighted gain resistors. In some examples, the respective first gain switches comprise a plurality of binary-weighted first gain switches, each subsequent first gain switch in the plurality of binary-weighted first gain switches having an on-resistance value equal to two times an on-resistance value of a prior first gain switch in the plurality of binary-weighted first gain switches, and wherein the respective second gain switches comprise a plurality of binary-weighted second gain switches, each subsequent second gain switch in the plurality of binary-weighted second gain switches having an on-resistance value equal to two times an on-resistance value of a prior second gain switch in the plurality of binary-weighted second gain switches.

In some examples, the first resistive element further comprises a plurality of first resistors and a plurality of first dummy switches, the first resistor being one of the plurality of first resistors and the first dummy switch being one of the plurality of first dummy switches, the second resistive element further comprises a plurality of second resistors and a plurality of second dummy switches, the second resistor being one of the plurality of second resistors and the second dummy switch being one of the plurality of second dummy switches, the first end of the first resistive element further comprises collective first ends of each of the plurality of first resistors, a second end of each of the plurality of first resistors is connected to a first end of a respective one of the plurality of first dummy switches, and the second end of the first resistive element further comprises collective second ends of each of the plurality of first dummy switches, and the first end of the second resistive element further comprises collective first ends of each of the plurality of second resistors, a second end of each of the plurality of second resistors is connected to a first end of a respective one of the plurality of second dummy switches, and the second end of the second resistive element further comprises collective second ends of each of the plurality of second dummy switches.

In some examples, the device further includes a third amplifier that comprises a third non-inverting input, a third inverting input, and a third output, wherein the third output of the third amplifier is connected to an output voltage terminal, a third resistor, wherein a first end of the third resistor is connected to the first output of the first amplifier, and a second end of the third resistor is connected to the third inverting input of the third amplifier, and a fourth resistor, wherein a first end of the fourth resistor is connected to the second output of the second amplifier, and a second end of the fourth resistor is connected to the third non-inverting input of the third amplifier. In such example, the device may also include a fifth resistor, wherein a first end of the fifth resistor is connected to the third inverting input of the third amplifier, and a second end of the fifth resistor is connected to the third output of the third amplifier and a sixth resistor, wherein a first end of the sixth resistor is connected to the third non-inverting input of the third amplifier, and a second end of the sixth resistor is connected to ground or to a reference voltage source.

In some examples, the control input comprises one or more binary digits, and the respective gain switches are operable to receive a binary digit of the one or more binary digits, responsive to receiving a binary one, close the switch, and responsive to receiving a binary zero, open the switch. In some examples, the device is implemented as a monolithic integrated circuit. In some examples, the first dummy switch and the second dummy switch are permanently in an on state.

The techniques described herein may be implemented in any Complementary Metal-Oxide-Semiconductor (CMOS) process, such as an integrated circuit process that incorporates thin-film or polysilicon resistors. As one example, an integrated circuit operating in accordance with one or more of the techniques described herein may be implemented in a high-temperature silicon-on-insulator process.

The circuit components described in this disclosure can be implemented as discrete components, as one or more integrated devices, or any combination thereof. The circuit components described herein may be fabricated using any of a wide variety of process technologies including Complementary Metal-Oxide-Semiconductor (CMOS) process technologies. In addition, the circuitry described herein may be used in various applications including telecommunications applications, general computing applications, etc.

Various circuit components, modules or units are described in this disclosure to emphasize functional aspects of devices and components configured to perform the disclosed techniques, but do not necessarily require realization by different circuit components. Rather various components may be combined or provided by a collection of interoperative circuit components. In addition, functional aspects of various components or devices described herein may be performed by more or other types of components.

Various examples have been described. These and other examples are within the scope of the following claims.

What is claimed is:

1. A device comprising:
   a first amplifier that comprises a first non-inverting input, a first inverting input, and a first output, wherein the first non-inverting input of the first amplifier is connected to a first input voltage terminal;
   a first resistive element that comprises a first resistor and a first dummy switch, wherein a first end of the first resistive element is connected to the first output of the first amplifier, and a second end of the first resistive element is connected to the first inverting input of the first amplifier;
   a second amplifier that comprises a second non-inverting input, a second inverting input, and a second output, wherein the second non-inverting input of the second amplifier is connected to a second input voltage terminal;
   a second resistive element that comprises a second resistor and a second dummy switch, wherein a first end of the second resistive element is connected to the second output of the second amplifier, and a second end of the second resistive element is connected to the second inverting input of the second amplifier; and
   a programmable resistive gain element operable to receive control input, wherein a resistance value of the programmable resistive gain element is based at least in part on the received control input, wherein a first end of the programmable resistive gain element is connected to both the first inverting input of the first amplifier and to the second end of the first resistive element, and wherein a second end of the programmable resistive gain element is connected to both the second inverting input of the second amplifier and to the second end of the second resistive element.

2. The device of claim 1, wherein resistance values of the first and second resistive elements, when compared to a resistance value of the programmable resistive gain element, maintain a specified ratio regardless of operating temperatures ranging from −55 degrees Celsius to 300 degrees Celsius.

3. The device of claim 1, wherein the programmable resistive gain element comprises one or more gain resistors and respective gain switches.

4. The device of claim 3:
   wherein the respective gain switches are respective first gain switches;
   wherein the programmable resistive gain element further comprises respective second gain switches;
   wherein the first end of the first resistive element comprises a first end of the first resistor, a second end of the first resistor is connected to a first end of the first dummy switch, and the second end of the first resistive element comprises a second end of the first dummy switch;
   wherein the first end of the second resistive element comprises a first end of the second resistor, a second end of the second resistor is connected to a first end of the second dummy switch, and the second end of the second resistive element comprises a second end of the second dummy switch; and
   wherein the first end of the programmable resistive gain element comprises collective first ends of each of the respective first gain switches, a second end of each of the respective first gain switches is connected to a first end of a respective one of the one or more gain resistors, a second end of each of the one or more gain resistors is connected to a second end of the respective second gain switch, and the second end of the programmable resistive gain element comprises collective first ends of each of the respective second gain switches.

5. The device of claim 4, wherein the one or more gain resistors comprise a plurality of binary-weighted gain resistors, each subsequent gain resistor in the plurality of binary-weighted gain resistors having a resistance value equal to two times a resistance value of a prior gain resistor in the plurality of binary-weighted gain resistors.

6. The device of claim 5, wherein the respective first gain switches comprise a plurality of binary-weighted first gain switches, each subsequent first gain switch in the plurality of binary-weighted first gain switches having an on-resistance value equal to two times an on-resistance value of a prior first gain switch in the plurality of binary-weighted first gain switches, and wherein the respective second gain switches comprise a plurality of binary-weighted second gain switches, each subsequent second gain switch in the plurality of binary-weighted second gain switches having an on-resistance value equal to two times an on-resistance value of a prior second gain switch in the plurality of binary-weighted second gain switches.

7. The device of claim 1, further comprising:
a third amplifier that comprises a third non-inverting input, a third inverting input, and a third output, wherein the third output of the third amplifier is connected to an output voltage terminal;
a third resistor, wherein a first end of the third resistor is connected to the first output of the first amplifier, and a second end of the third resistor is connected to the third inverting input of the third amplifier;
a fourth resistor, wherein a first end of the fourth resistor is connected to the second output of the second amplifier, and a second end of the fourth resistor is connected to the third non-inverting input of the third amplifier;
a fifth resistor, wherein a first end of the fifth resistor is connected to the third inverting input of the third amplifier, and a second end of the fifth resistor is connected to the third output of the third amplifier; and
a sixth resistor, wherein a first end of the sixth resistor is connected to the third non-inverting input of the third amplifier, and a second end of the sixth resistor is connected to ground or to a reference voltage source.

8. The device of claim 1 wherein the control input comprises one or more binary digits, and the respective gain switches are operable to:
receive a binary digit of the one or more binary digits;
responsive to receiving a binary one, close the switch; and
responsive to receiving a binary zero, open the switch.

9. The device of claim 1, wherein the device is implemented as a monolithic integrated circuit.

10. The device of claim 1, wherein each of the respective gain switches comprises a transistor.

11. The device of claim 1, wherein the first dummy switch and the second dummy switch are permanently in an on state.

12. A device comprising:
a first amplifier that comprises a first non-inverting input, a first inverting input, and a first output, wherein the first non-inverting input of the first amplifier is connected to a first input voltage terminal;
a second amplifier that comprises a second non-inverting input, a second inverting input, and a second output, wherein the second non-inverting input of the second amplifier is connected to a second input voltage terminal;
a third amplifier that comprises a third non-inverting input, a third inverting input, and a third output, wherein the third output of the third amplifier is connected to an output voltage terminal;
a first resistor, wherein a first end of the first resistor is connected to the first output of the first amplifier, and a second end of the first resistor is connected to a first end of a first dummy switch;
a second resistor, wherein a first end of the second resistor is connected to the second output of the second amplifier, and a second end of the second resistor is connected to a first end of a second dummy switch;
a third resistor, wherein a first end of the third resistor is also connected to the first output of the first amplifier, and a second end of the third resistor is connected to the third inverting input of the third amplifier;
a fourth resistor, wherein a first end of the fourth resistor is connected to the second output of the second amplifier, and a second end of the fourth resistor is connected to the third non-inverting input of the third amplifier;
a fifth resistor, wherein a first end of the fifth resistor is connected to the third inverting input of the third amplifier, and a second end of the fifth resistor is connected to the third output of the third amplifier;
a sixth resistor, wherein a first end of the sixth resistor is connected to the third non-inverting input of the third amplifier, and a second end of the sixth resistor is connected to ground; and
a programmable resistive gain element operable to receive input and adjust a resistance value of the programmable resistive gain element based at least in part on the received input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

13. The device of claim 12, wherein the programmable resistive gain element comprises one or more gain resistors, respective first gain switches, and respective second gain switches.

14. The device claim 13,
wherein the first end of the programmable resistive gain element comprises collective first ends of the respective first gain switches,
wherein a second end of each of the respective first gain switches is connected to a first end of a respective one of the one or more gain resistors,
wherein a second end of each of the one or more gain resistors is connected to a second end of one of the respective second gain switches, and
wherein the second end of the programmable resistive gain element comprises collective second ends of the respective second gain switches.

15. The device of claim 14, wherein the one or more gain resistors comprise a plurality of gain resistors, each subsequent gain resistor in the plurality of gain resistors having a resistance value equal to two times a resistance value of a prior gain resistor in the plurality of gain resistors.

16. The device of claim 13, wherein a temperature coefficient of each of the respective first gain switches, a temperature coefficient of each of the respective second gain switches, a temperature coefficient of the first dummy switch, and a temperature coefficient of the second dummy switch are substantially the same.

17. An integrated circuit comprising:
a first amplifier that comprises a non-inverting input, an inverting input, and an output, wherein the non-inverting input is connected to a first input voltage terminal;
a second amplifier that comprises a non-inverting input, an inverting input, and an output, wherein the non-inverting input is connected to a second input voltage terminal;
a third amplifier that comprises a non-inverting input, an inverting input, and an output, wherein the output is connected to an output voltage terminal;
a first resistor, wherein a first end of the first resistor is connected to the output of the first amplifier, and a second end of the first resistor is connected to a first end of a first dummy switch;
a second resistor, wherein a first end of the second resistor is connected to the output of the second amplifier, and a second end of the second resistor is connected to a first end of a second dummy switch;

a third resistor, wherein a first end of the third resistor is also connected to the output of the first amplifier, and a second end of the third resistor is connected to the inverting input of the third amplifier;

a fourth resistor, wherein a first end of the fourth resistor is connected to the output of the second amplifier, and a second end of the fourth resistor is connected to the non-inverting input of the third amplifier;

a fifth resistor, wherein a first end of the fifth resistor is connected to the inverting input of the third amplifier, and a second end of the fifth resistor is connected to the output of the third amplifier;

a sixth resistor, wherein a first end of the sixth resistor is connected to the non-inverting end of the third amplifier, and a second end of the sixth resistor is connected to ground; and a programmable resistive gain element operable to receive input and adjust a resistance value of the programmable resistive gain element based at least in part on the received input, wherein a first end of the programmable resistive gain element is connected to both the first inverting input of the first amplifier and to a second end of the first dummy switch, and wherein a second end of the programmable resistive gain element is connected to both the second inverting input of the second amplifier and to a second end of the second dummy switch.

18. The integrated circuit of claim 17, wherein the programmable resistive gain element comprises one or more gain resistors, respective first gain switches, and respective second gain switches, and wherein a temperature coefficient of each of the respective first gain switches, a temperature coefficient of each of the respective second gain switches, a temperature coefficient of the first dummy switch, and a temperature coefficient of the second dummy switch are substantially the same.

* * * * *

UNITED STATES PATENT AND TRADEMARK OFFICE
CERTIFICATE OF CORRECTION

PATENT NO.        : 9,065,400 B2
APPLICATION NO.   : 14/033113
DATED             : June 23, 2015
INVENTOR(S)       : Mark R. Larson Page 1 of 1

It is certified that error appears in the above-identified patent and that said Letters Patent is hereby corrected as shown below:

Specification, col. 1, lines 7 and 8: "...with Government support under FA8650-10-M-2084..." should be changed to --...with Government support under FA8650-11-C-2195...--

Signed and Sealed this
Twenty-first Day of June, 2016

Michelle K. Lee
*Director of the United States Patent and Trademark Office*